United States Patent
Lee et al.

(10) Patent No.: US 9,352,364 B2
(45) Date of Patent: May 31, 2016

(54) METHOD AND APPARATUS FOR REMOVING ORGANIC MATERIALS

(71) Applicant: Samsung Electronics Co., Ltd., Suwon-si (KR)

(72) Inventors: Jun-ho Lee, Hwaseong-si (KR); Seung-yeon Lee, Seoul (KR); Kang-hee Lee, Suwon-si (KR); Seon-ah Jin, Pocheon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 409 days.

(21) Appl. No.: 13/874,595

(22) Filed: May 1, 2013

(65) Prior Publication Data

US 2014/0069456 A1    Mar. 13, 2014

(30) Foreign Application Priority Data

Sep. 7, 2012   (KR) .......................... 10-2012-0099550

(51) Int. Cl.
| | | |
|---|---|---|
| *B08B 7/02* | (2006.01) | |
| *H01L 21/02* | (2006.01) | |
| *B08B 7/00* | (2006.01) | |

(52) U.S. Cl.
CPC .......... *B08B 7/028* (2013.01); *H01L 21/02046* (2013.01); *B08B 7/00* (2013.01)

(58) Field of Classification Search
CPC .............. B08B 7/028; H01L 21/02046; H01L 21/02096
See application file for complete search history.

(56) References Cited

U.S. PATENT DOCUMENTS

| | | | |
|---|---|---|---|
| 4,850,380 A * | 7/1989 | Koslow | B01D 53/0407 134/105 |
| 5,098,684 A | 3/1992 | Kresge et al. | |
| 6,106,626 A * | 8/2000 | Guan | C23C 16/4401 118/715 |
| 6,205,676 B1 * | 3/2001 | Fujii | B08B 6/00 134/1.3 |
| 2003/0049937 A1 * | 3/2003 | Suzuki | H01J 37/32009 438/714 |
| 2005/0252455 A1 * | 11/2005 | Moriya | H01L 21/67103 118/729 |
| 2008/0061000 A1 | 3/2008 | Janssen et al. | |
| 2010/0104760 A1 * | 4/2010 | Matsui | C23C 16/4401 427/294 |

FOREIGN PATENT DOCUMENTS

| | | |
|---|---|---|
| JP | 2005-225682 A | 8/2005 |
| JP | 2005-225705 A | 8/2005 |
| JP | 4596233 B2 | 10/2010 |
| JP | 4680515 B2 | 2/2011 |
| KR | 1020080010187 A | 1/2008 |
| KR | 100834803 B1 | 5/2008 |
| KR | 1020120046004 A | 5/2012 |
| KR | 101189197 B1 | 10/2012 |

* cited by examiner

*Primary Examiner* — Michael Kornakov
*Assistant Examiner* — Natasha Campbell
(74) *Attorney, Agent, or Firm* — Cantor Colburn LLP

(57) ABSTRACT

A method for removing organic materials includes providing a target object having the organic materials adsorbed thereon, and an adsorbent, into a space including a non-liquid medium therein; and separating the organic materials from the target object by applying ultrasound waves to the target object having the organic materials adsorbed thereon and the adsorbent in the space, and disposing the organic materials to the adsorbent.

14 Claims, 8 Drawing Sheets

METHOD AND APPARATUS FOR REMOVING ORGANIC MATERIALS

This application claims priority to Korean Patent Application No. 10-2012-0099550, filed on Sep. 7, 2012, and all the benefits accruing therefrom under 35 U.S.C. §119, the disclosure of which is incorporated herein in its entirety by reference.

BACKGROUND

1. Field

Provided are a method and apparatuses for removing organic materials, and more particularly, a method and apparatus for removing organic materials existing on the surface of a target object by using an adsorbent in a dry atmosphere.

2. Description of the Related Art

In general, various kinds of unnecessary organic materials irrelevant to a natural state of a matter may be adsorbed onto the surface of the matter such as by being introduced when the matter or a product including the matter is manufactured, used and/or stored. Even though an amount of the organic materials is relatively small, the organic materials usually degrade the properties of the product or deteriorate a state of the product.

Typically, to remove organic materials, aqueous or wet cleaning methods using various kinds of solvents, surfactants or gases are used. For example, a method of removing organic materials by oxidizing the organic materials through a chemical reaction with the organic materials is popularly known. Most aqueous cleaning methods are performed using a poisonous gas or solvent in a high-temperature, high-pressure or vacuum atmosphere.

SUMMARY

Provided is a method of removing organic materials in a dry atmosphere at a normal temperature without using solvents or separate gases.

Provided is an apparatus for removing organic materials without using solvents or separate gases.

Additional features will be set forth in part in the description which follows and, in part, will be apparent from the description, or may be learned by practice of the presented embodiments.

Provided is a method of removing organic materials, and the method includes providing a target object having the organic materials adsorbed thereon, and an adsorbent, into a space including a non-liquid medium therein; and separating the organic materials from the target object by applying ultrasound waves to the target object having the organic materials adsorbed thereon and the adsorbent in the space, and disposing the organic materials on the adsorbent.

The method may further include separating the adsorbent having the organic materials attached thereto, from the target object after the ultrasound waves are applied.

In the method, the space may include a chamber including a gaseous medium, and the separating the organic materials from the target object may include applying the ultrasound waves to the target object having the organic materials adsorbed thereon and the adsorbent in the gaseous medium of the chamber.

The chamber may include a surface on which static electricity is generated due to friction between the adsorbent and the surface.

In the method, the providing a target object and an adsorbent may include placing the adsorbent adjacent to the target object; and the separating the organic materials from the target object may include placing an ultrasonicator at a location adjacent to the adjacent adsorbent and target object, and applying ultrasound waves generated by the ultrasonicator to the adjacent adsorbent and target object.

The target object may include particles, and the organic materials may be on surfaces of the organic particles.

A mean diameter of the particles may be about 3 nanometers to about 1000 nanometers, specifically about 5 nanometers to about 800 nanometers.

The target object may further include a supporter which supports the particles.

The target object may include a polymeric material, and the organic materials may be on a surface of the polymeric material.

The target object may include a high-molecular film, and the organic materials may be on a surface of the high-molecular film.

The target object may include a semiconductor substrate or a printed circuit board, and the organic materials may be on a surface of the semiconductor substrate or the printed circuit board.

The separating the adsorbent from the target object may include applying a gas to the target object.

The separating the adsorbent from the target object may include using an electrostatic force.

The adsorbent may include carbon black, a metal-organic framework ("MOF") compound, a zeolitic imidazolate framework ("ZIF") compound, a covalent-organic framework ("COF") compound, activated carbon, zeolite, silica, a metal oxide, or a combination thereof, or a material obtained by carbonization, oxidation or heating of the foregoing.

Provided is an apparatus for removing organic materials, and the apparatus includes: a chamber which accommodates a target object having the organic materials adsorbed thereon, and an adsorbent, in a non-liquid atmosphere; an ultrasonicator which is adjacent to the chamber, generates an ultrasonic wave in an ultrasound wave generation region of the chamber, and causes contact between the organic materials on the target object and the adsorbent; and a target object fixing unit which is inside the chamber and supports or fixes the target object having the organic materials adsorbed thereon.

The apparatus may further include a shutter which separates the ultrasound wave generation region of the chamber from the target object fixing unit.

The apparatus may further include a connection port in communication with an inside of the chamber, and through which the adsorbent is provided into or discharged from the inside of the chamber.

The ultrasonicator may variably generate ultrasound waves of tens of kilohertz (KHz) to hundreds of KHz.

The target object fixing unit may include a material having thermal or electrical conductivity.

BRIEF DESCRIPTION OF THE DRAWINGS

These and/or other features will become apparent and more readily appreciated from the following description of the embodiments, taken in conjunction with the accompanying drawings of which.

DETAILED DESCRIPTION

Figure 1:
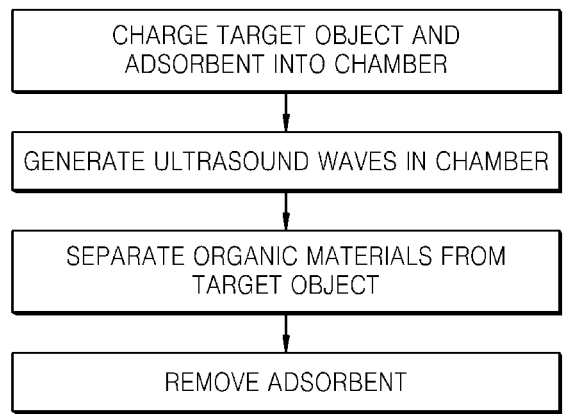
FIG. 1 is a flowchart illustrating an embodiment of a method of removing organic materials, according to the present invention.

Embodiments of a method and apparatus for removing organic materials according to the present invention will now be described in detail with reference to the accompanying drawings, where the thicknesses of layers and regions in the drawings are exaggerated for clarity of the specification.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically, fluidly and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In existing organic material removal methods, in particular, wet cleaning methods, it is not easy to perform the wet cleaning methods and it is difficult to recollect a used solvent or the like. In addition, even though the types of used solvents and reaction temperatures thereof may be chosen according to the types of organic materials, some organic materials may remain. In addition, since solvents, surfactants or poisonous gases used to remove organic materials are harmful to a living being such as a human body, secondary contamination may be caused.

Hereinafter, the invention will be described in detail with reference to the accompanying drawings.

One or more embodiment of a method of removing organic materials according to the present invention includes: charging (e.g., introducing) a target object to which the organic materials are adsorbed and an adsorbent into a predetermined space; and separating the organic materials from the surface of the target object by applying ultrasound waves to the space so that the separated organic materials are attached to the adsorbent adjacent to the target object. The space in which the organic materials are separated from the target object and attached to the adsorbent is a space in which a non-liquid medium is contained, wherein the non-liquid medium may be a gaseous medium, e.g., a gaseous atmosphere. That is, the method corresponds to a process of removing organic materials in a dry manner. An embodiment of the method will now be described with reference to FIG. 1.

FIG. 1 is a flowchart illustrating an embodiment of a method of removing organic materials, according to the present invention.

Referring to FIG. 1, first, a target object to which the organic materials are adsorbed and an adsorbent are charged into a predetermined space, such as a chamber.

The target object is a matter to which organic materials may be adsorbed and is a target from which the organic materials are removed by one or more embodiment of the method according to the present invention. A material and a shape of the target object are not limited. In one embodiment, for example, the target object may include a metal, a nonmetallic material, an oxide, a boride, a carbide, a nitride, a mixture thereof or an oxide thereof. In addition, the target object may have a film shape or a nanoparticle shape. A nanoparticle shape may include a discrete element or member, while a film shape may include a relatively thin and/or uniform sheet-like member.

In embodiments, for example, the target object may include a high-molecular weight material, such as a polymeric material having a molecular weight of about 10,000 to about 1,000,000 Daltons (Da), specifically about 20,000 to about 800,000 Da, more specifically about 40,000 to about 600,000 Da, such as a synthetic rubber resin or a synthetic fiber, and may be in the form of a film. In one embodiment, for example, the target object may include a polymeric material, and may comprise a polyimide, a polyester, a polycarbonate, a polyolefin, a polystyrene, a polyether, a polyestersul-fone ("PES"), a polyvinyl system resin, a poly(meth)acrylate or the like.

The target object has no limitation in magnitude or dimension, e.g., the target object may have a mean diameter equal to or greater than several centimeters (cm). The target object may be a particle having a size of several nanometers to hundreds of nanometers or several nanometers to hundreds of micrometers. The particle may be a dot, a wire, a rod, a tube, a sheet or a flake. Alternatively, the target object may be a printed circuit board ("PCB").

The organic materials may be physisorbed or simply adsorbed to the surface of the target object regardless of characteristics, properties and a function of the target object. In embodiments, for example, the organic materials include, but are not limited to, volatile organic compounds ("VOCs"), various kinds of hydrocarbons and the like existing in the air, and may include microorganisms, such as bacteria and viruses.

The adsorbent indicates a material to which the organic materials separated from the surface of the target object are adsorbed. The adsorbent may include, for example, carbon black, a metal-organic framework ("MOF") compound, zeolitic imidazolate framework ("ZIF") compound, a covalent-organic framework ("COF") compound, activated carbon, zeolite, silica, a metal oxide, or a combination thereof, or a material obtained by carbonization, oxidation or heating of the foregoing.

A magnitude and a shape of the adsorbent are not limited and may be arbitrarily adjusted and used. In embodiments, for example, the adsorbent may be a nano-adsorbent having a mean magnitude equal to or less than about 1 micrometer (µm). The adsorbent may have a particle shape or a film shape. In addition, an adsorbent having a relatively large specific surface area equal to or greater than 10 square meters per gram ($m^2/g$), 20 $m^2/g$ or 50 $m^2/g$ may be selectively used, and a porous-structure material, the surface area of which is maximized, may be used as the adsorbent.

The adsorbent may be selectively used according to physical properties of the organic materials. When the organic materials include a polar substance, the adsorbent of a polar substance may be used, and when the organic materials include a nonpolar substance, the adsorbent of a nonpolar substance may be used.

The chamber may be a container for providing a predetermined space in which the target object to which the organic materials are adsorbed and the adsorbent are charged. A surface of the chamber may be non-conductive. The chamber may include a material other than the adsorbent or a material having electronegativity different from that of the adsorbent. In addition, the chamber may have a surface from which static electricity is generated due to friction between the adsorbent and the surface of the container.

Next, referring again to FIG. 1, after the target object to which the organic materials are adsorbed and the adsorbent are charged into the chamber, ultrasonication is performed by applying ultrasound waves inside the chamber. The space, such as the chamber in which the target object to which the organic materials are adsorbed and the adsorbent are charged, may be a region in which a non-liquid medium, e.g. a gaseous medium, is filled. The method may be a dry process performed by applying ultrasound waves in a non-liquid atmosphere. The ultrasound waves indicate sound waves having a frequency (equal to or greater than about 20 kilohertz (KHz)) higher than an audible frequency band and have the properties, such as a short wavelength, a slow transfer speed and a high energy transmissivity. Kinetic energy of the adsorbent may be increased by the ultrasonication so that the adsorbent is freely dispersed in the chamber to form clouds. A number of physical contacts or collisions may occur between individual adsorbent particles and the surface of the target object. In one embodiment, a frequency of the ultrasound waves applied in the ultrasonication may be equal to or greater than about 20 KHz and equal to or less than hundreds of KHz.

As such, when physical contacts or collisions occur between the adsorbent and the surface of the target object, the organic materials adsorbed to the surface of the target object are separated from the surface of the target object and attached to the adsorbent. The separation of the organic materials from the surface of the target object and the attachment of the organic materials to the adsorbent may be performed by a van der Waals force or an electrostatic force.

Finally, the process of removing the organic materials from the surface of the target object may include removing the adsorbent to which the organic materials are attached from the inside of the chamber to separate the adsorbent to which the organic materials are attached from the target object. As a method of removing the adsorbent from the chamber, compressed air which is blown or static electricity which may be generated due to the friction between the adsorbent and the surface of the container, may be used.

Figure 2A:
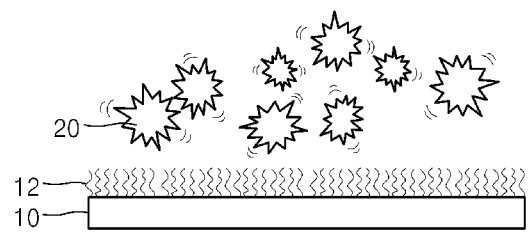
FIGS. 2A and 2B are diagrams for describing an embodiment of a method of removing organic materials from a surface of a target object, according to the present invention.
Figure 2B:
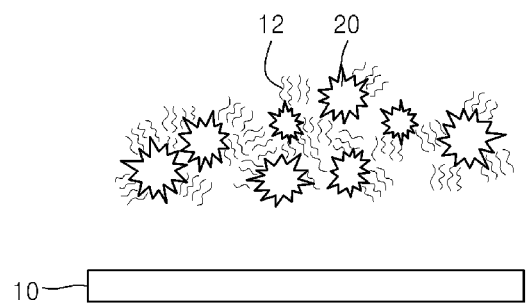

FIGS. 2A and 2B are diagrams for describing removing organic materials 12 from the surface of a target object 10 by the method of FIG. 1, according to the present invention.

Referring to FIG. 2A, the organic materials 12 are adsorbed to the surface of the target object 10, and an adsorbent 20 is located above the target object 10. Although the adsorbent 20 is represented as a substantially spherical shape having protrusions in FIG. 2A, a shape and a magnitude of the adsorbent 20 are not limited. In one embodiment, for example, the adsorbent 20 may have a plate shape facing the target object 10.

Referring to FIG. 2B, when ultrasound waves having an oscillation frequency equal to or greater than 20 KHz and equal to or less than hundreds of KHz are applied to the target object 10 and the adsorbent 20 within a defined space, kinetic energy of individual particles of the adsorbent 20 may increase. The increase of kinetic energy of individual particles of the adsorbent 20 results in collisions between the adsorbent 20 and the target object 10 and thereby, collisions between the adsorbent and the organic material 12 on the target 10. Accordingly, the organic materials 12 on the surface of the target object 10 are attached to the surface of the adsorbent 20 and thereby separated from the target object 10.

Figure 3A:
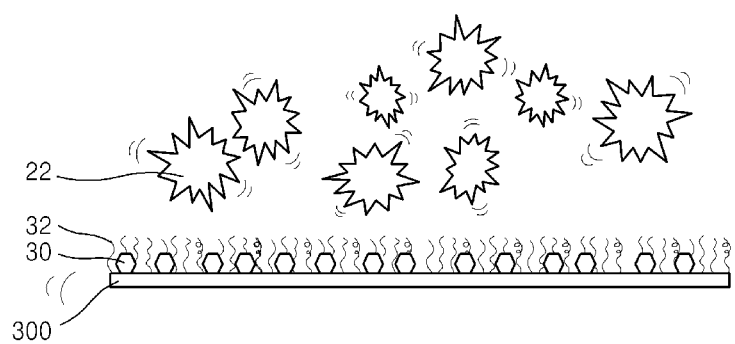
FIGS. 3A and 3B are diagrams for describing an embodiment of a method of removing organic materials from surfaces of nanoparticles when a target object includes the nanoparticles, according to the invention.
Figure 3B:
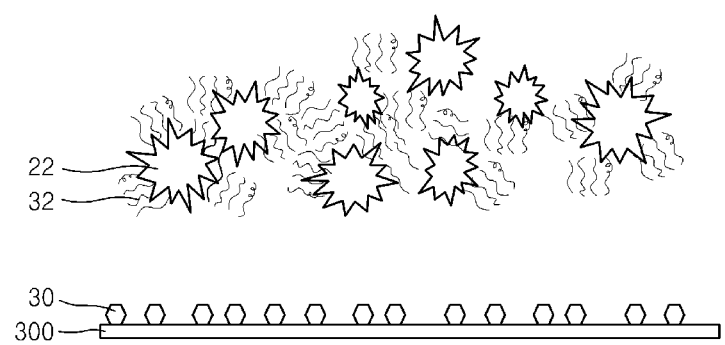

FIGS. 3A and 3B are diagrams for describing an embodiment of a method of removing organic materials 32 from surfaces of nanoparticles when a target object 30 includes the nanoparticles, according to the present invention.

The target object may collectively include the nanoparticles, and a supporter which supports the nanoparticles thereon. Referring to FIG. 3A, the target object nanoparticles 30 are located on a supporter 300, and the organic materials 32 are adsorbed to the surfaces of the target object nanoparticles 30. An adsorbent 22 is located above the target object nanoparticles 30. Although the adsorbent 22 is represented as a substantially particle shape having protrusions in FIG. 3A, a shape and a magnitude of the adsorbent 22 are not limited.

Referring to FIG. 3B, when ultrasound waves are applied to the target object nanoparticles 30 and the adsorbent 22 in a non-liquid medium, kinetic energy of individual particles of the adsorbent 22 may increase. The increase of kinetic energy of individual particles of the adsorbent 22 results in collisions between the adsorbent 22 and the organic materials 32 on the surface of the target object nanoparticles 30 which in turn attaches the organic materials 32 to the adsorbent 22 and separates the organic materials 32 from the target object nanoparticles 30.

Figure 4A:
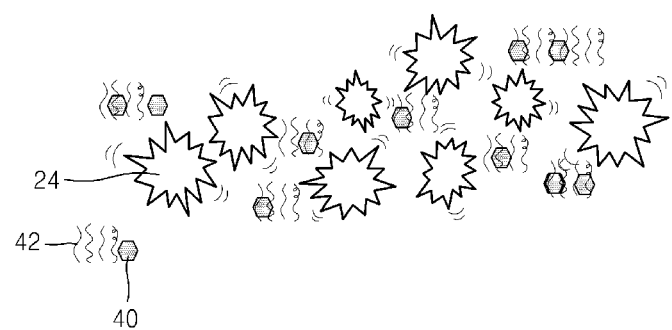
FIGS. 4A and 4B are diagrams for describing an embodiment of a method of removing organic materials from surfaces of nanoparticles when the nanoparticles and an adsorbent are mixed, according to the present invention.
Figure 4B:
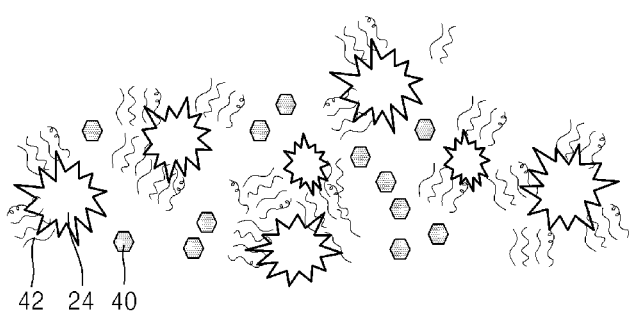

FIGS. 4A and 4B are diagrams for describing an embodiment of a method of removing organic materials 42 from surfaces of a plurality of nanoparticles when the plurality of nanoparticles and an adsorbent 24 are mixed such as in a powder state, according to the present invention.

Referring to FIG. 4A, a target object 40 includes nanoparticles, and the organic materials 42 are adsorbed to the surfaces of the target object nanoparticles 40. The adsorbent 24 is mixed with the target object nanoparticles 40 such as to form a mixture thereof.

Referring to FIG. 4B, when ultrasound waves are applied to the target object nanoparticles 40 mixed with the adsorbent 24, kinetic energy of individual particles of the adsorbent 24 may increase. The increase of kinetic energy of individual particles of the adsorbent 24 results in collisions between the adsorbent 24 and the organic materials 42 on the surface of the target object nanoparticles 40 which in turn attaches the organic material 42 to the adsorbent 24 and separates the organic materials 42 from the target object nanoparticles 40.

One or more embodiments of the method of removing organic materials from the surfaces of nanoparticles may be variously used in processes of manufacturing, using and observing nanoparticles. Since nanoparticles manufactured by a colloid or evaporation method have a wide specific surface area and high surface energy, precursors, unreacted residual materials, a number of surfactants, a solvent having a high boiling point, a reduction reagent and various kinds of hydrocarbons introduced from the outside may be adsorbed to the surfaces of the nanoparticles in the processes of manufacturing, using and observing the nanoparticles. Through ultrasonication using an adsorbent in a gaseous medium, organic materials physisorbed or simply adsorbed to the nanoparticles may be selectively removed without removing elements which should remain with the nanoparticles such as ligands directly bonded to the surfaces of the nanoparticles and a stabilizing agent and/or a surfactant chemically bonded or adsorbed to the nanoparticles.

When nanoparticles are used or observed with an electron microscope, materials adsorbed to the surfaces of the nanoparticles may be undesirably removed. In general, to observe nanoparticles with an electron microscope, samples are collected by diluting the nanoparticles and organic materials using a solution, such as chloroform or methylene chloride, after particle synthesis, but it is not easy to perform high-resolution observation and long-time observation. When ultrasound waves are applied to nanoparticle samples together with an adsorbent in a dry atmosphere according to the present invention, the organic materials, such as hydrocarbon, may be easily removed from the surfaces of nanoparticles, and super-high-resolution observation and long-time observation of the nanoparticles may be performed.

Figure 5:
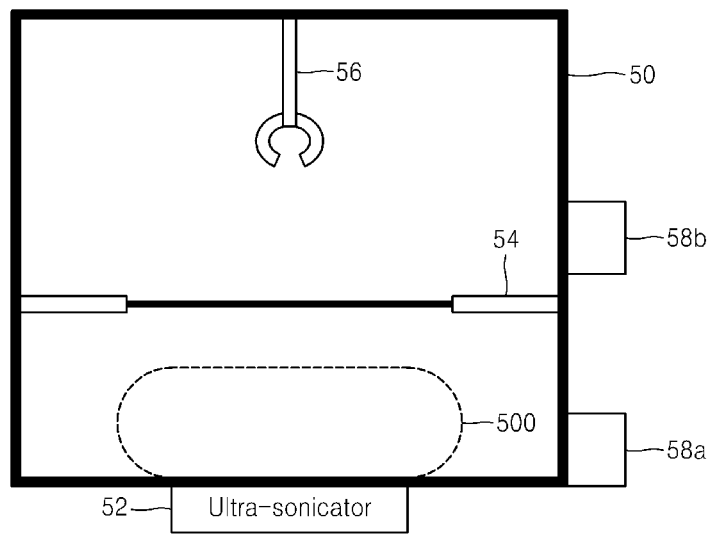
FIG. 5 is a conceptual diagram of an embodiment of an apparatus for removing organic materials, according to the present invention.

FIG. 5 is a conceptual diagram of an embodiment of an apparatus for removing organic materials, according to the present invention. Referring to FIG. 5, the apparatus may include a chamber 50, an ultrasonicator 52 disposed at a side of the chamber 50, and a target object fixing unit 56 which is mounted inside the chamber 50 and to which a target object is fixed. An ultrasound wave generation region 500 caused by the ultrasonicator 52 may exist in the inside of the chamber 50, which corresponds to a region in which the ultrasonicator 52 is disposed. A shutter 54 configured to separate the ultrasound wave generation region 500 from the target object fixing unit 56 may be selectively disposed inside the chamber 50. In addition, connection ports 58a and 58b for introducing or discharging an adsorbent, a gas, and so forth into or out of the chamber 50 therethrough and/or for inserting a measurement device or other application device therethrough may be further selectively included in the chamber 50. The connection ports 58a and 58b may be in physical, fluid and/or electrical communication with an inside of the chamber 50.

The ultrasonicator 52 may generate and variably adjust ultrasound waves having a frequency band of tens of KHz to hundreds of KHz. The target object fixing unit 56 may include a material having thermal and/or electrical conductivities, and if necessary, the target object fixing unit 56 may be configured to receive heat, electricity and/or ultrasound waves from outside the apparatus.

An embodiment of a method of removing organic materials using the illustrated apparatus according to the present invention will now be described.

First, a target object to which organic materials are adsorbed is fixed to the target object fixing unit 56 in the chamber 50. A magnitude and a shape of the target object fixing unit 56 may vary according to a magnitude and a shape of the target object. Thereafter, an adsorbent is charged into the ultrasound wave generation region 500. Thereafter, the shutter 54 is open, and the target object fixing unit 56 is moved so that the target object fixed to the target object fixing unit 56 is inserted into the ultrasound wave generation region 500. Accordingly, the target object to which the organic materials are adsorbed and the adsorbent exist in the ultrasound wave generation region 500.

Next, ultrasound waves having a frequency band of tens of KHz to hundreds of KHz are generated by the ultrasonicator 52. The generated ultrasound waves cause the organic materials adsorbed to the target object to be attached to the adsorbent and separated from the target object. A time of generating the ultrasound waves by the ultrasonicator 52 may be arbitrary adjusted and is not limited.

When the ultrasound processing is completed, the target object fixing unit 56 and the target object fixed to the target object fixing unit 56 is removed from the ultrasound wave generation region 500. Thereafter, the adsorbent having the organic materials bonded thereto is discharged outside the chamber 50 such as by using a gas, e.g., compressed air emitted by an air blower and/or static electricity. While the organic material removing process progresses, a non-liquid medium, e.g., a gaseous medium, may be filled up inside the chamber 50, and accordingly, the embodiment of the method of the organic material removing process according to the present invention may be performed in a dry process.

As described above, one or more embodiment of the organic material removing method according to the present invention may be performed at a normal or suitable temperature, e.g., about 20 degrees Celsius (° C.) to about 100° C., specifically room temperature, without using a separate solvent. In addition, the types of organic materials which can be removed by the embodiment of the organic material removing method are not limited.

Figure 6A:
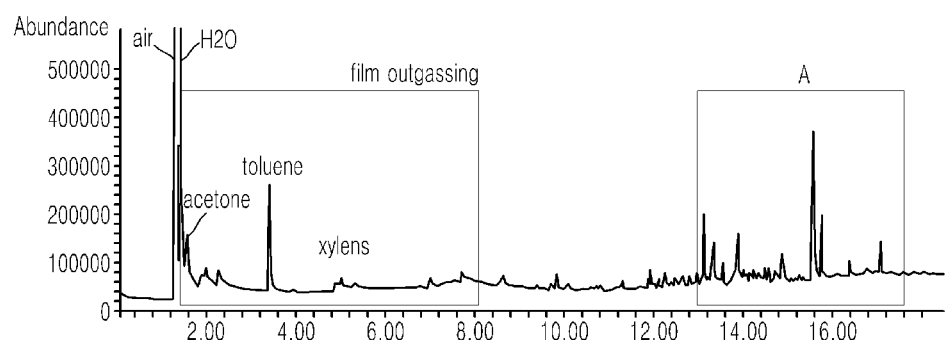
FIGS. 6A and 6B are graphs showing surface analysis results with respect to a target object before and after organic materials adsorbed to the surface of the target object are removed, when the target object is a high-molecular film according to the present invention.
Figure 6B:
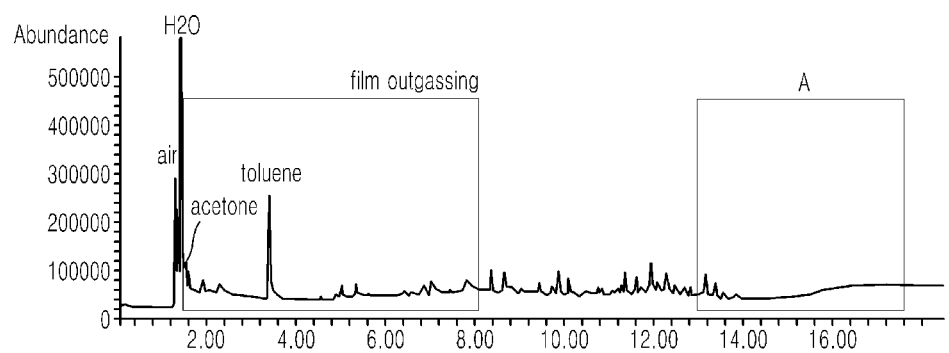

FIGS. 6A and 6B are graphs showing surface analysis results with respect to a target object before and after organic materials adsorbed to the surface of the target object are removed according to the present invention. An amount or abundance of a material is indicated by the y-axis.

In FIGS. 6A and 6B, the target object is a polyimide (PI) film that is relatively weak when subjected to heat, and a carbon black is used as an adsorbent. The PI film and the carbon black are charged into a chamber, and ultrasound processing is performed by applying ultrasound waves having a frequency of about 44 KHz to the PI film and the carbon black such as by an ultrasonicator for several minutes. A Gas Chromatography/Mass spectrometry ("GC/MS") of a thermal desorption method is used to analyze residual materials on the PI film.

Referring to FIGS. 6A and 6B, while organic materials (a region A) exist on the surface of the PI film that is the target object before the organic materials are removed as shown in FIG. 6A, effectively no organic materials are observed on the surface of the target object PI film after the organic materials are removed as shown in FIG. 6B. That is, organic materials initially adsorbed to a target object, such as the PI film which is weak when subjected to heat, are removed at a normal or suitable temperature, e.g., about 20° C. to about 100° C., specifically room temperature, without using a high-temperature process.

Figure 7A:
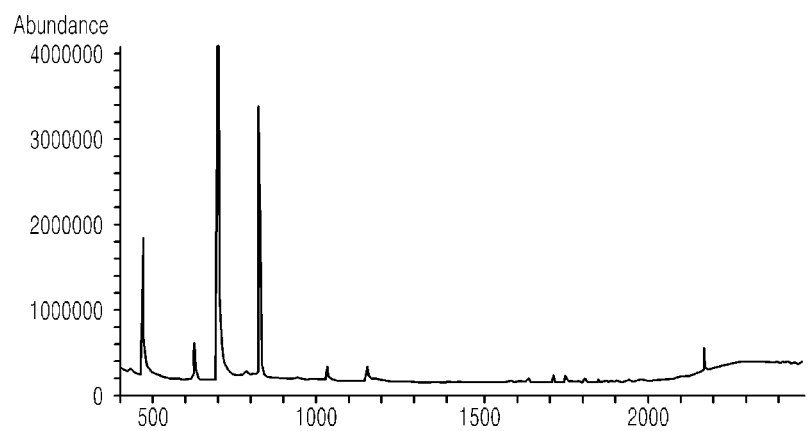
FIGS. 7A and 7B are graphs showing analysis results with respect to a surface of an adsorbent before and after an organic material removing process according to the present invention.
Figure 7B:
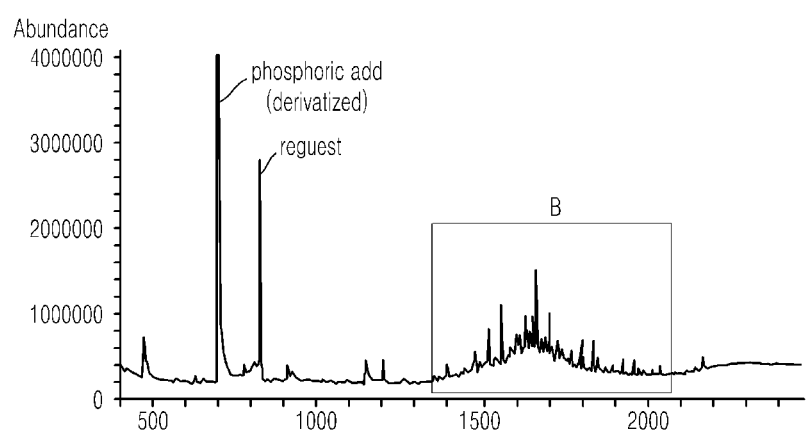

FIGS. 7A and 7B are graphs showing analysis results with respect to a surface of an adsorbent before and after an organic material removing process according to the present invention. In FIGS. 7A and 7B, cobalt zeolitic imidazolate framework ("Co-ZIF") is used as the adsorbent, and ultrasound processing is performed by applying ultrasound waves having a frequency of about 44 KHz by an ultrasonicator for about 3 minutes. A GC/MS of a thermal desorption method is used to analyze residual materials on the Co-ZIF adsorbent.

Referring to FIGS. 7A and 7B, after the organic material removing process as shown in FIG. 7B, organic materials of various kinds of hydrocarbon components are detected (region B) from the surface of the adsorbent. In contrast, before the organic material removing process as shown in FIG. 7A, there is effectively no organic materials detected. That is, organic materials on a target object are attached to the adsorbent in the organic material removing process after the organic material removing process.

Figure 8A:
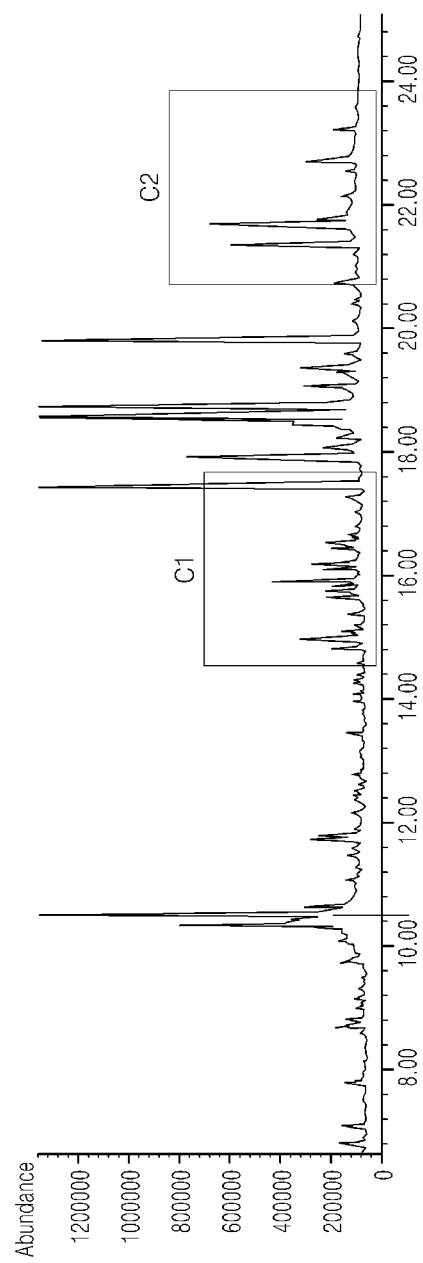
FIGS. 8A and 8B are graphs showing surface analysis results with respect to a target object before and after organic materials adsorbed to the surface of the target object are removed, when the target object includes nanoparticles, according to the present invention.
Figure 8B:
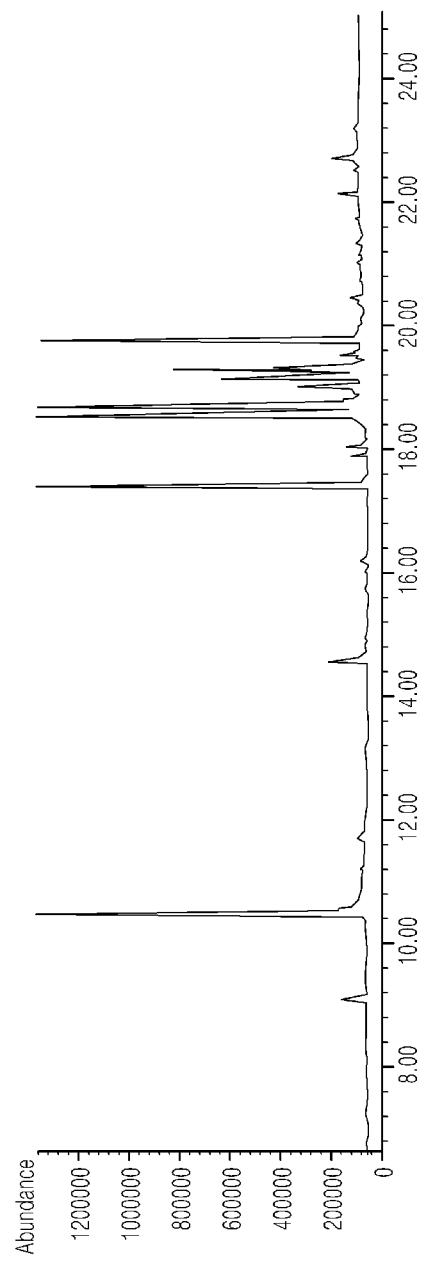

FIGS. 8A and 8B are graphs showing surface analysis results with respect to a target object before and after organic materials adsorbed to the surface of the target object are removed when the target object includes nanoparticles, according the present invention.

After manufacturing the nanoparticles (e.g., quantum dots), simply adsorbed materials are removed from the surfaces of the nanoparticles in a general aqueous cleaning method. In this state, as an analysis result using a GC/MS of a thermal desorption method, residual materials, such as a tri-n-octylphosphine oxide ("TOPO"), are detected in regions C1 and C2 as shown in FIG. 8A.

Where residual materials remain on surfaces of the nanoparticles, an ultrasound processing is performed by applying ultrasound waves having a frequency of about 44 KHz in a dry atmosphere. After the ultrasound processing is performed as described above, when the surface of the target object is analyzed as shown in FIG. 8B, the organic materials in the regions C1 and C2, e.g., the residual materials such as a TOPO, are removed while ligands of the nanoparticles are maintained. That is, in an embodiment of the organic material removing method according to the present invention, a small amount of residual materials, which have not been removed in a general aqueous cleaning method, may be thereafter removed, and organic materials on the surface of a target having a functional surface may be selectively removed.

One or more embodiment of the organic material removing method may be applicable to various fields, e.g., a process of cleaning semiconductors/displays, and may contribute to an increased life span of an organic reflection film in an optical lens. One or more embodiment of the organic material removing method may be used to remove organic materials on surfaces of various types of films or high-molecular materials and remove organic materials attached to surfaces of particles such as when nanoparticles are manufactured. In addition, through removing organic materials on a specimen, resolution of a transmission electron microscope, a scanning electron microscope or an X-ray diffraction analyzer may be improved, and an analysis time may be improved.

As described above, one or more embodiment of the present invention, unlike aqueous cleaning methods, provides an organic material removing method for significantly reducing environmental problems and harmful effects to a human body and for selectively removing organic materials on the surface of a matter having a functional surface, where the method is easily performed at a normal temperature.

In addition, one or more embodiment of the organic material removing method may be applicable to a process of cleaning semiconductors/displays and may contribute to an increased life span of an organic reflection film in an optical lens. In addition, organic materials on surfaces of various types of films or high-molecular materials may be removed, and through removing organic materials on a specimen, resolution of a transmission electron microscope, a scanning electron microscope, or an X-ray diffraction analyzer may be improved, and an analysis time may be improved.

It should be understood that the embodiments described herein should be considered in a descriptive sense only and not for purposes of limitation. Descriptions of features within each embodiment should typically be considered as available for other similar features in other embodiments.

What is claimed is:

1. A method of removing organic materials, the method comprising:
   providing a target object having the organic materials adsorbed on a surface thereof, and an adsorbent, into a space comprising a non-liquid medium therein; and
   separating the organic materials from the target object, comprising:
   applying ultrasound waves to the target object having the organic materials adsorbed on the surface thereof and the adsorbent, in the space;
   contacting the adsorbent with the organic materials on the surface of the target object by applying the ultrasound waves in the space; and
   disposing the organic materials on the adsorbent by contacting the adsorbent with the organic materials.

2. The method of claim 1, the separating the organic materials from the target object further comprising separating the adsorbent having the organic materials disposed thereon from the target object after the ultrasound waves are applied.

3. The method of claim 1, wherein:
   the non-liquid medium is a gaseous medium;

the space is a chamber comprising the gaseous medium; and the ultrasound waves are applied to the target object having the organic materials adsorbed on the surface thereof and the adsorbent, in the gaseous medium of the chamber.

4. The method of claim 3, wherein the chamber further comprises a surface on which static electricity is generated due to friction between the adsorbent and the surface.

5. The method of claim 1, wherein:

providing a target object and an adsorbent comprises placing the adsorbent adjacent to the target object; and applying the ultrasound waves to the target object comprises placing an ultrasonicator at a location adjacent to the adjacent adsorbent and target object, and applying ultrasound waves generated by the ultrasonicator to the adjacent adsorbent and target object.

6. A method of removing organic materials, the method comprising:

providing a target object having the organic materials adsorbed thereon, and an adsorbent, into a space comprising a non-liquid medium therein; and separating the organic materials from the target object by applying ultrasound waves to the target object having the organic materials adsorbed thereon and the adsorbent in the space, and disposing the organic materials on the adsorbent, wherein the target object comprises particles, and the organic materials are adsorbed on surfaces of the particles.

7. The method of claim 6, wherein a mean diameter of the particles is 3 nanometers to 1000 nanometers.

8. The method of claim 6, wherein the target object further comprises a supporter which supports the particles.

9. The method of claim 1, wherein the target object comprises a polymeric material, and the organic materials are adsorbed on a surface of the polymeric material.

10. The method of claim 1, wherein the target object comprises a polymeric material in the form of a film, and the organic materials are adsorbed on a surface of the film.

11. The method of claim 1, wherein the target object comprises a semiconductor substrate or a printed circuit board, and the organic materials are adsorbed on a surface of the semiconductor substrate or the printed circuit board.

12. The method of claim 2, wherein separating the adsorbent from the target object comprises applying a gas to the target object.

13. The method of claim 2, wherein separating the adsorbent from the target object comprises using an electrostatic force.

14. The method of claim 1, wherein the adsorbent comprises carbon black, a metal-organic framework compound, a zeolitic imidazolate framework compound, a covalent-organic framework compound, activated carbon, a zeolite, silica, a metal oxide, or a combination thereof, or a material obtained by carbonization, oxidation, or heating of the foregoing.

* * * * *